United States Patent
Lee et al.

(10) Patent No.: US 9,368,232 B2
(45) Date of Patent: Jun. 14, 2016

(54) MAGNETIC AUTOMATIC TEST EQUIPMENT (ATE) MEMORY TESTER DEVICE AND METHOD EMPLOYING TEMPERATURE CONTROL

(71) Applicant: QUALCOMM Incorporated, San Diego, CA (US)

(72) Inventors: Kangho Lee, San Diego, CA (US); Wah Nam Hsu, San Diego, CA (US); Xiao Lu, San Diego, CA (US); Seung H. Kang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/787,938

(22) Filed: Mar. 7, 2013

(65) Prior Publication Data

US 2014/0254251 A1   Sep. 11, 2014

(51) Int. Cl.
| | |
|---|---|
| *G11C 29/00* | (2006.01) |
| *G11C 29/08* | (2006.01) |
| *G11C 11/16* | (2006.01) |
| *G11C 7/04* | (2006.01) |
| *G01R 31/27* | (2006.01) |
| *G11C 29/04* | (2006.01) |
| *G11C 29/56* | (2006.01) |

(52) U.S. Cl.
CPC ............ *G11C 29/04* (2013.01); *G11C 29/00* (2013.01); *G11C 29/56016* (2013.01); *G11C 7/04* (2013.01); *G11C 11/16* (2013.01)

(58) Field of Classification Search
CPC ........... G11C 29/00; G11C 11/16; G11C 7/04
USPC .......................................... 365/158, 201, 211
See application file for complete search history.

(56) References Cited

U.S. PATENT DOCUMENTS

| | | | |
|---|---|---|---|
| 4,105,971 A | 8/1978 | Nevalainen | |
| 5,752,264 A | 5/1998 | Blake et al. | |
| 6,163,477 A | 12/2000 | Tran | |
| 6,204,679 B1 | 3/2001 | Gray, III | |
| 6,268,740 B1 * | 7/2001 | Iida .......................... | 324/750.19 |
| 6,294,911 B1 | 9/2001 | Shimazawa et al. | |

(Continued)

FOREIGN PATENT DOCUMENTS

| | | |
|---|---|---|
| CN | 101236233 B | 9/2012 |
| JP | H085666 A | 1/1996 |

(Continued)

OTHER PUBLICATIONS

Smullen, C.W. et al., "Relaxing Non-volatility for Fast and Eenergy-efficient STT-RAM Caches", 2011 IEEE 17th International Symposium on High Performance Computer Architecture (HPCA), Feb. 12-16, 2011, IEEE Comput. Soc, IEEE, Piscataway, NJ, USA, pp. 50-61, ISSN: 978-1-4244-9432-3; DOI: 10.1 109/HPCA.2011.5749716.

(Continued)

*Primary Examiner* — Ly D Pham
(74) *Attorney, Agent, or Firm* — Toler Law Group, PC

(57) ABSTRACT

In a particular embodiment, a method includes controlling a temperature within a chamber while applying a magnetic field. A device including a memory array is located in the chamber. The method includes applying a magnetic field to the memory array and testing the memory array during application of the magnetic field to the memory array at a target temperature.

28 Claims, 6 Drawing Sheets

(56) References Cited

U.S. PATENT DOCUMENTS

| | | |
|---|---|---|
| 6,406,545 B2 | 6/2002 | Shoda et al. |
| 6,452,823 B1 | 9/2002 | Naji |
| 6,621,731 B2 | 9/2003 | Bessho et al. |
| 6,947,315 B2 | 9/2005 | Iwata |
| 7,023,726 B1 | 4/2006 | Chen et al. |
| 7,183,763 B1 | 2/2007 | Murata |
| 7,230,420 B2 | 6/2007 | Patland et al. |
| 7,538,546 B2 | 5/2009 | Patland et al. |
| 7,741,860 B2 | 6/2010 | Giessmann et al. |
| 7,872,471 B2 | 1/2011 | Yamanaka et al. |
| 7,995,383 B2 | 8/2011 | Li et al. |
| 8,040,131 B2 | 10/2011 | Call et al. |
| 2005/0111253 A1 | 5/2005 | Park et al. |
| 2005/0169059 A1* | 8/2005 | Perner et al. ............ 365/189.01 |
| 2008/0180109 A1 | 7/2008 | Gregoritsch et al. |
| 2009/0249899 A1* | 10/2009 | Wong et al. ................ 73/865.6 |
| 2010/0153646 A1 | 6/2010 | Chen et al. |
| 2011/0002163 A1 | 1/2011 | Fukami et al. |
| 2011/0044096 A1 | 2/2011 | Li |
| 2011/0154089 A1 | 6/2011 | Wolfe et al. |
| 2011/0167222 A1 | 7/2011 | Lee et al. |
| 2012/0018823 A1 | 1/2012 | Huai et al. |
| 2012/0210188 A1 | 8/2012 | Fee et al. |
| 2013/0279244 A1 | 10/2013 | Kang et al. |
| 2014/0139209 A1 | 5/2014 | Lee et al. |

FOREIGN PATENT DOCUMENTS

| | | |
|---|---|---|
| JP | 2003069111 A | 3/2003 |
| JP | 2009115456 A | 5/2009 |

OTHER PUBLICATIONS

Zhenyu, S., et al., "Multi Retention Level STT-RAM Cache Designs with a Dynamic Refresh Scheme", Proceeding MICRO-44 '11 Proceedings of the 44th Annual IEEE/ACM International Symposium on Microarchitecture, Dec. 7, 2011, pp. 329-338, XP55068180, Porto Alegre, Brazil DOI: 10.1145/2155620.2155659 ISBN: 978-1-45-031053-6.

International Search Report and Written Opinion—PCT/US2014/017745—ISA/EPO—Jun. 25, 2014 10 pages.

* cited by examiner

MAGNETIC AUTOMATIC TEST EQUIPMENT (ATE) MEMORY TESTER DEVICE AND METHOD EMPLOYING TEMPERATURE CONTROL

I. FIELD

The present disclosure is generally related to automatic test equipment (ATE) and methods of testing memory devices.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Semiconductor technology has been used in enabling such computing devices to be smaller and more powerful. Semiconductor technology faces continuing challenges such as scaling down device size and reducing power consumption. Magnetoresistive random-access memory (MRAM) technology shows promise in being able to achieve increased device density and lower power consumption.

III. SUMMARY

A magnetic automated testing equipment (ATE) system that enables temperature control during magnetic testing of magnetoresistive random-access memory (MRAM) arrays, such as spin-transfer torque (STT) MRAM memory arrays, is described. To fabricate spin-transfer torque (STT) MRAM devices at deeply-scaled semiconductor technology nodes, magnetic tunnel junctions (MTJs) have to scale down accordingly. The volume of a storage layer in MTJ elements decreases at advanced technology nodes. Since the energy barrier between two MTJ states is proportional to the volume, this trend poses a significant challenge to meeting data retention requirements. In addition, various magnetic properties of MTJ elements are dependent on temperature, which tends to degrade data retention properties of MTJ elements at elevated temperatures. Therefore, it is desirable to test magnetic properties of an MTJ array at high temperatures to evaluate high-temperature data retention failures. However, conventional magnetic testing systems do not support temperature control and magnetic field application simultaneously. Hence, magnetic properties of an MTJ array have been reported only at room temperature.

The magnetic ATE system described herein may be configured to control a temperature of a device (e.g., a package) that includes an MRAM array and to apply a magnetic field to the MRAM array. For example, the magnetic ATE system may be configured to test or characterize one or more magnetic properties of an STT-MRAM array at a target test temperature or within a target test temperature range. As part of the memory test, a magnet may be activated to generate a magnetic field that is applied to the memory array of the device. During the memory test, the magnet may be configured to apply a magnetic field of five hundred Oe or above to the memory array.

For example, a testing apparatus, such as a magnetic ATE system, may include a holder that is configured to receive a device including a memory array to be tested. The testing apparatus includes a thermal control unit that is movable with respect to the holder to establish (e.g. form) a chamber. The thermal control unit is operable to change the temperature within the chamber. For example, the thermal control unit may apply heat to regulate a temperature of the chamber while the device is in the chamber. When the temperature within the chamber reaches a target test temperature, a memory test unit may initiate a memory test to evaluate performance of the memory array at the target test temperature. Thus, the memory array may be evaluated (e.g., tested) at a target test temperature while a desired magnetic field is applied to the memory array.

In a particular embodiment, a method includes controlling a temperature within a chamber while a device including a memory array is located in the chamber. The method also includes applying a magnetic field to the memory array and testing the memory array during application of the magnetic field to the memory array at a target temperature.

In another particular embodiment, a testing apparatus includes a holder configured to receive a device to be tested. The device includes a memory array. The testing apparatus includes a thermal control unit. The thermal control unit is moveable with respect to the holder to establish a chamber to contain the device and is configured to change a temperature within the chamber. The testing apparatus further includes a magnet to produce a magnetic field that is applied to the memory array during testing of the memory array while the device is within the chamber.

In a further particular embodiment, an apparatus includes means for receiving a device to be tested. The apparatus also includes means for controlling a temperature within a chamber. The device includes a memory array and is located within the chamber. The apparatus further includes means for applying a magnetic field to the memory array during testing of the device within the chamber. The apparatus also includes means for testing the memory array during application of the magnetic field to the memory array.

In another particular embodiment, a method for testing a memory array using a magnet is disclosed. The method includes a step for controlling a temperature within a chamber. A device including a memory array is located in the chamber. The method also includes a step for applying a magnetic field to the memory array. The method further includes a step for testing the memory array during application of the magnetic field to the memory array.

In another particular embodiment, a non-transitory computer readable medium includes instructions that, when executed by a processor, cause the processor to initiate testing of a memory array. A device including the memory array is located in the chamber. A temperature within the chamber is controlled and a magnetic field is applied to the memory array. The memory array is tested during application of the magnetic field to the memory array.

One particular advantage provided by at least one of the disclosed embodiments is that a magnetic field is applied to a device under test while the device is located in a temperature controlled chamber. Another particular advantage provided by at least one of the disclosed embodiments is a system that integrates an electromagnet and a thermal control unit to enable temperature-controlled magnetic measurements of a memory array, such as an MRAM. The system may control a temperature of a device to be at a target test temperature or within a target test temperature range. Data generated during testing enables the memory array to be characterized at the target test temperature or within the target test temperature range. Data acquired during testing may be used to improve MRAM design or may be included in a data sheet corresponding to the device. Another particular advantage of at least one of the disclosed embodiments is that magnetic fields may be applied to a memory array, such as an STT-MRAM array, that are strong enough to induce a stage change of one or more STT-MRAM cells of the STT-MRAM array.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described below with reference to the drawings. In the description, common features are designated by common reference numbers throughout the drawings.

Figure 1:
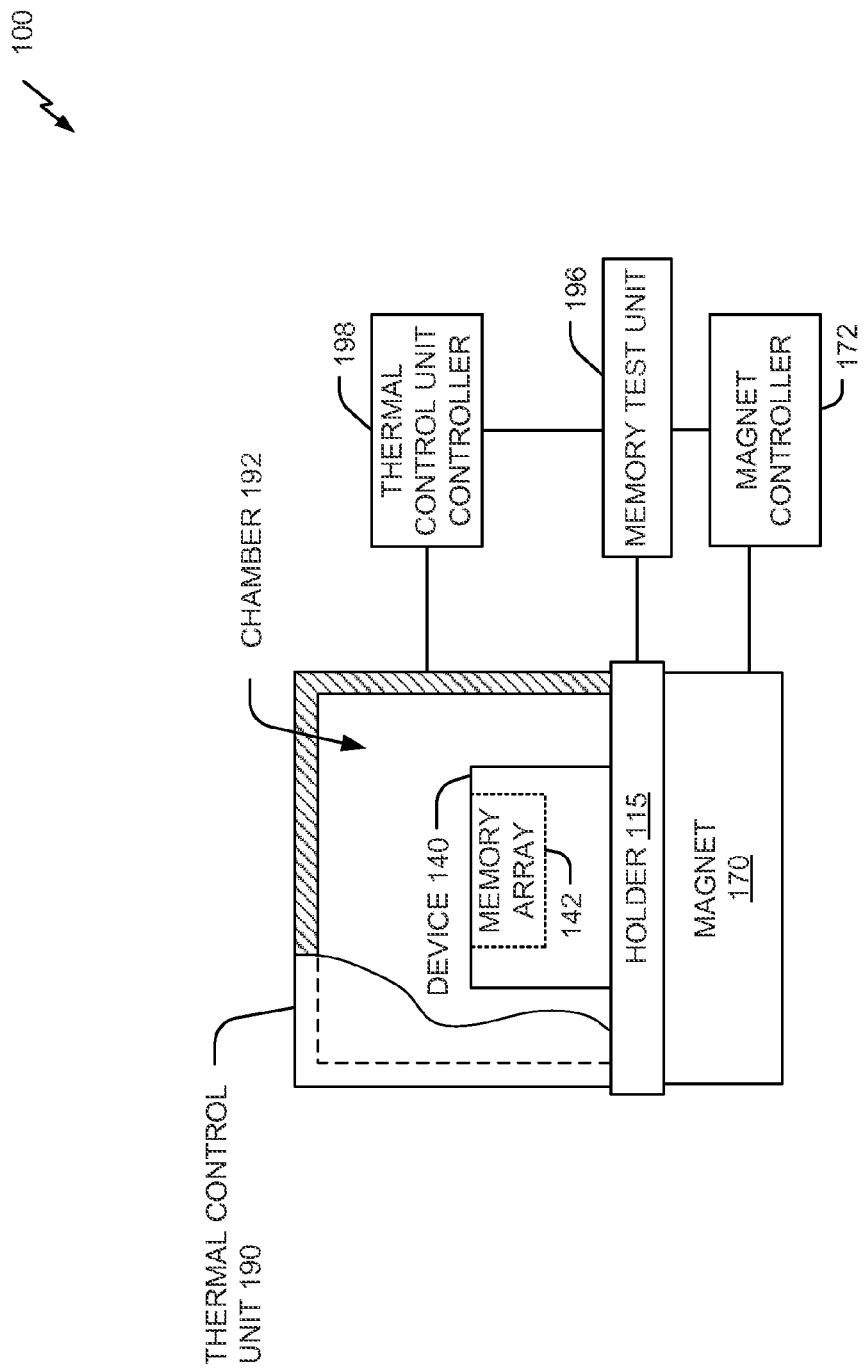
FIG. 1 is a diagram of a first particular embodiment of a testing apparatus for testing a memory array.

Referring to FIG. 1, an embodiment of a testing apparatus 100 is shown. The testing apparatus 100 includes a holder 115, a magnet 170, a thermal control unit 190, a magnet controller 172, a thermal control unit controller 198, and a memory test unit 196. A broken out view of the thermal control unit 190 illustrates a device 140 positioned on the holder 115.

The holder 115 is configured to receive the device 140 to be tested. The holder 115 may have contacts (e.g., conductive bumps) to couple the holder 115 to the device 140 (e.g., contacts of the device 140). The contacts of the holder 115 may be electrically coupled to or otherwise in communication with the memory test unit 196. The contacts of the holder 115 may enable the memory test unit 196 to perform testing of the device 140. The holder 115 may comprise a loadboard, a socket, or a combination thereof. In a particular embodiment, the holder 115 comprises a loadboard having a socket attached thereto, as described with respect to FIG. 2.

The device 140 may be positioned on or within the holder 115. The device 140 may include a memory array 142. The device 140 may include any device that is affected by a magnetic field, a temperature, or a combination thereof. For example, the device 140 may be a package (e.g., a memory device) that includes the memory array 142. The memory array 142 may include one or more memory elements, such as a plurality of magnetic tunneling junction (MTJ) elements. In a particular embodiment, the memory array 142 includes a plurality of MTJ elements. For example, the memory array 142 may include a magneto resistive random-access memory (MRAM) element, such as a spin torque transfer (STT) MRAM element, a dynamic random access memory (DRAM) element, a static random-access memory (SRAM) element, a phase-change memory (PRAM) element, or another type of memory element. In a particular embodiment, the MRAM is a spin torque transfer (STT) MRAM.

The thermal control unit 190 may be movable and may be positioned with respect to the holder 115 to form (e.g., establish) a chamber 192. The thermal control unit 190 may be positioned relative to the holder 115 manually or automatically to establish the chamber 192. The chamber 192 may be established by the thermal control unit 190, the holder 115, and an adapter. For example, the thermal control unit 190 may be positioned so that the thermal control unit 190 is in contact with the holder 115. As another example, the thermal control unit 190 may be configured to be received by an adapter (not shown) that is coupled to the holder 115 and configured to receive the thermal control unit 190.

The thermal control unit 190 may include a temperature control element (e.g., a heating element, a cooling element, or a combination thereof), a thermocouple, or a combination thereof. The thermal control unit 190 is operable to regulate a temperature within the chamber 192. The thermal control unit 190 may regulate the temperature within the chamber 192 to reach and maintain a single temperature value or a temperature within a range of temperature values, for a period of time. For example, the thermal control unit 190 may apply heat to change a temperature within the chamber 192 while the device 140 is located in the chamber 192.

The thermal control unit 190 may be coupled to a thermal control unit controller 198. The thermal control unit controller 198 may receive one or more inputs associated with operation of the thermal control unit 190 (e.g., a target test temperature or a temperature range). For example, the thermal control unit controller 198 may receive one or more inputs from the memory test unit 196 or via a graphical user interface of the thermal control unit controller 198. The thermal control unit controller 198 may send one or more control signals to the thermal control unit 190 based on the one or more inputs. Thermal control units are commercially available. Devices manufactured by WELLS-CTI are examples of the thermal control unit 190 and the thermal control unit controller 198.

A device to be tested, such as the device 140, may be placed on (e.g., in) the holder 115 and the thermal control unit 190 may be positioned relative to the holder 115 to establish the chamber 192. In a particular embodiment, the thermal control unit 190 may be placed in contact with and fixed (e.g., secured) in a position with respect to the holder 115. The thermal control unit 190 may receive one or more control signals from the thermal control unit controller 198 that cause the thermal control unit 190 to adjust or maintain a temperature within the chamber 192. For example, the thermal control unit 190 may adjust or maintain the temperature within the chamber 192 using the temperature control element, the thermocouple, or a combination thereof, of the thermal control unit 190. The temperature control element, the thermocouple, or a combination thereof, may be positioned proximate to a surface of the device 140 to regulate a temperature within the chamber 192. In a particular embodiment, the temperature control element, the thermocouple, or a combination thereof, are in contact with a surface of the device 140 and regulate a temperature of the device 140.

The magnet 170 may include an electromagnet, such as a projected-field electromagnet, controlled by a magnet controller 172. The magnet 170 may generate one or more magnetic fields that are applied to an object (e.g., the device 140) positioned on or within the holder 115. Depending on a magnet pole design of the magnet 170, the magnet 170 can generate in-plane and/or perpendicular fields, such as described with reference to FIGS. 3A-D.

Magnetic poles of the magnet 170 may be designed to generate uniform fields to be applied to the memory array 142. For example, the magnet 170 may be positioned relative to the device 140 on (or in) the holder 115 to apply a substantially uniform portion of the generated magnetic field(s) to the memory array 142. The magnetic field(s) may be applied in-plane and/or perpendicular to the device 140 (e.g., the memory array 142). In a particular embodiment, the substantially uniform portion of the magnetic field is applied perpendicular to a plane of the memory array.

The magnet 170 may be moved, manually or mechanically, to be positioned proximate to or in contact with the holder 115. For example, the magnet 170 may be positioned underneath the holder 115 (e.g., opposite a side of the holder 115 that receives the device 140). In a particular embodiment, the magnet 170 is positioned relative to the holder 115 such that a top surface of the magnet 170 is substantially parallel with a surface (e.g. a top surface) of the device 140 when the device 140 is positioned on or within the holder 115.

The magnet controller 172 may be coupled to the magnet 170. The magnet controller 172 may receive one or more inputs (e.g., turn on, turn off, magnetic field strength). The magnet controller 172 may receive the one or more inputs from the memory test unit 196 or via a graphical user interface of the magnet controller 172. The magnet controller 172 may send one or more magnet control signals to the magnet 170 responsive to the one or more inputs. The one or more magnet control signals may cause the magnet 170 to generate, or to stop generating, a magnetic field(s).

The memory test unit 196 may be coupled to the thermal control unit controller 194, the magnet controller 172, or a combination thereof. The memory test unit 196 is configured to test the memory array 142. For example, the memory test unit 196 may test the memory array 142 within the chamber 192 when the temperature of the chamber 192 is at the target test temperature, when a particular magnetic field is applied to the memory array 142 by the magnet 170, or a combination thereof. For example, when the temperature within the chamber 192 reaches the target test temperature, the memory test unit 196 may cause the magnet controller 172 to activate the magnet 170, and the memory test unit 196 may initiate a test (e.g., a change of state test) of the memory array 142 to evaluate the performance of the memory array 142 at the target test temperature. The memory array 142 within the device 140 (e.g., a device under test) may be tested while the temperature within the chamber 192 is at, or substantially at, the target test temperature. Thus, the memory test unit 196 may test the memory array 142 during application of a magnetic field from the magnet 170 and at a target test temperature regulated by the thermal control unit 190.

The memory test unit 196 may test one or more characteristics of a memory device, such as the memory array 142, to qualify a data retention requirement of the memory device. For example, the memory test unit 196 may enable a thermal disturb rate associated with the memory array to be characterized at high temperatures. The memory test unit 196 may further enable an acceleration factor to be extracted to estimate an effective data retention of the memory array at a desired temperature that is generally a lower temperature than the high temperature at which the memory array was tested.

The thermal disturb rate of the memory array (e.g., a MTJ array) may be associated with a volume and a coercivity of a memory cell of the memory array. The coercivity of the memory cell is an intensity of a magnetic field needed to reduce a magnetization of a ferromagnetic material (e.g., a free layer of the memory cell) to zero after the ferromagnetic material has reached saturation. Coercivity tends to decrease as temperature increases. An intrinsic coercivity of each memory cell may vary based on material variations but is generally regarded as a constant value among the memory cells of the memory array.

The thermal disturb rate of the memory array may be determined based on a tail bit population of the memory array. Tail bits of the memory array generally refer to memory cells (e.g., memory elements) of the memory array that, because of process variations, have a threshold volume (e.g., a volume of a free layer) outside of a normal distribution of threshold volumes of the memory cells of the memory array. Operation of the tail bit cells may appear normal at normal operating temperatures. However, due to the volume of the tail bit cells being outside of the normal distribution, the tail bit cells may be affected by high temperatures. For example, the tail bit cells may more easily change a state (e.g., a value) at high temperatures than memory cells within the normal distribution. In this sense, testing the tail bits is useful to improve data retention or to estimate the acceleration factor of the memory array.

An amount of time for one state to be disturbed and change to another state is based on an energy barrier ($E_B$) of a memory cell. The energy barrier of the memory cell is an amount of energy (e.g., anisotropic energy) to retain a stored value. The energy barrier for the memory cell may be calculated:

$$E_B = \frac{H_K M_S V}{2},$$

where $H_K$ is an intrinsic coercivity (e.g., a value of a material magnetic anisotropic field of the free layer of the memory cell). $M_S$ is a saturation magnetization (e.g., a total moment) of a free layer of the memory cell, and V is a volume of the memory cell.

To characterize the intrinsic coercivity ($H_K$), the testing apparatus 100 may apply a magnetic field to the memory array while the memory array is within a chamber at a target test temperature. Different elements (e.g., different memory cells) of the memory array may be monitored to determine an amount of time (e.g., how long) for a state change to occur. Multiple time periods for the memory cell to change states may be averaged to determine a characteristic dwell time ($\tau$) at the target test temperature. The characteristic dwell time ($\tau$) is defined as:

$$\tau = \tau_0 \exp\left(\frac{E_B}{k_B T}\right),$$

where $\tau_0$ is a constant (e.g., an attempt frequency), $E_B$ is the energy barrier, $k_B$ is Boltzmann's constant, and T is temperature (in Kelvin).

Based on the characteristic dwell time ($\tau$) calculated at the target test temperature, a probability of thermal disturb (P) may be calculated as:

$$P = \exp\left(-\frac{t}{\tau}\right),$$

where t is time. By extrapolating from a probability distribution, a dwell time at a desired temperature (e.g. at twenty-five degrees Celsius) may be determined for the memory cell (e.g., for the memory array). The dwell time at the desired temperature may be associated with reliability of the memory cell and reliability of the memory array.

During operation of the testing apparatus 100, a test may be performed on the memory array 142 of the device 140. The device 140 may be placed in the holder 115. When the device 140 is placed in the holder 115, the device 140 may be electrically or communicatively coupled to the memory test unit 196.

The thermal control unit 190 may be positioned relative to the holder 115 to form the chamber 192, and the device 140 is within the chamber 192. After the chamber 192 is formed, the thermal control unit controller 198 controls the thermal control unit 190 to regulate a temperature within the chamber 192. For example, the temperature within the chamber 192 may be maintained (e.g., regulated) at a target test temperature at which the device 140 is to be tested.

When the temperature within the chamber 192 is at, or substantially at, the target test temperature, the memory test unit 196 may perform a test on the memory array 142 of the device 140. For example, the memory test unit 196 may initiate a memory test (or tests) to evaluate performance of the memory array 142 at the target test temperature. During the test, the memory test unit 196 may send or receive one or more signals with the device 140. The memory array 142 within the device 140 may be tested while the temperature within the chamber 192 is at, or substantially at, the target temperature. In particular embodiment, the memory test is initiated or otherwise triggered by the memory test unit 196 to start when the temperature within the chamber 192 is at the target test temperature. The memory test may include performing one or more operations on the memory array 142, monitoring the memory array 142, applying a magnetic field to the memory array 142, or a combination thereof.

In a particular embodiment, the magnet 170 is activated during the memory test of the memory array 142 to produce a magnetic field that is applied to the memory array 142. Magnetic field patterns that may be applied to the memory array 142 are described with respect to FIGS. 3A-D. The magnet controller 172 may send or receive one or more signals to control operation of the magnet 170. In a particular embodiment, the magnet 170 is positioned proximate to and in contact with the holder 115. The magnet 170 may also include or be coupled to a chiller (not shown) to cool the magnet 170 and to prevent the magnet 170 from overheating.

While the thermal control unit 190, the magnet 170, and the memory test unit 196 have been shown as part of the testing apparatus 100 (e.g. a single testing apparatus), it should be understood that each of the thermal control unit 190, the magnet 170, and the memory test unit 196 may be a separate component. For example, the thermal control unit 190 may be a first device that is separate and distinct from a second device that includes the magnet 170 and the memory test unit 196. Additionally, it should be understood that each of the magnet 170, the thermal control unit 192, and the test unit 196 may have a corresponding power supply. Alternatively, two or more of the magnet 170, the thermal control unit 192, and the memory test unit 196 may share a single power supply.

While the thermal control unit controller 194, the magnet controller 172, and the memory test unit 196 have been shown as separate units, it should be understood that a single controller to perform testing may include elements of, or may combine functionality of, each of the controller devices 172, 194, and 196. Such combined functionality may enable automated testing that coordinates actions of the thermal control unit 190, the magnet 170 and the test unit 196 with respect to testing of the device 140 within the chamber 192. For example, the memory test unit 196 may be configured to initiate testing of the memory array 142 at various temperatures as determined by the thermal control unit controller 194 and may test the memory array 142 while a magnetic field is applied by the magnet 170.

One particular advantage provided by at least one of the disclosed embodiments is that testing of a device including an MRAM array, such as an STT-MRAM array, may be performed while the temperature of the device is controlled. Testing of the MRAM array may include application of a magnetic field to the MRAM array while the device is at a target temperature or within a target temperature range. Such testing may enable magnetic properties of the MRAM array to be evaluated (e.g., characterized) at a desired temperature or over a desired range of temperatures. For example, tail bits may be characterized to provide feedback for engineers to design memory arrays having improved data retention rates.

Figure 2:
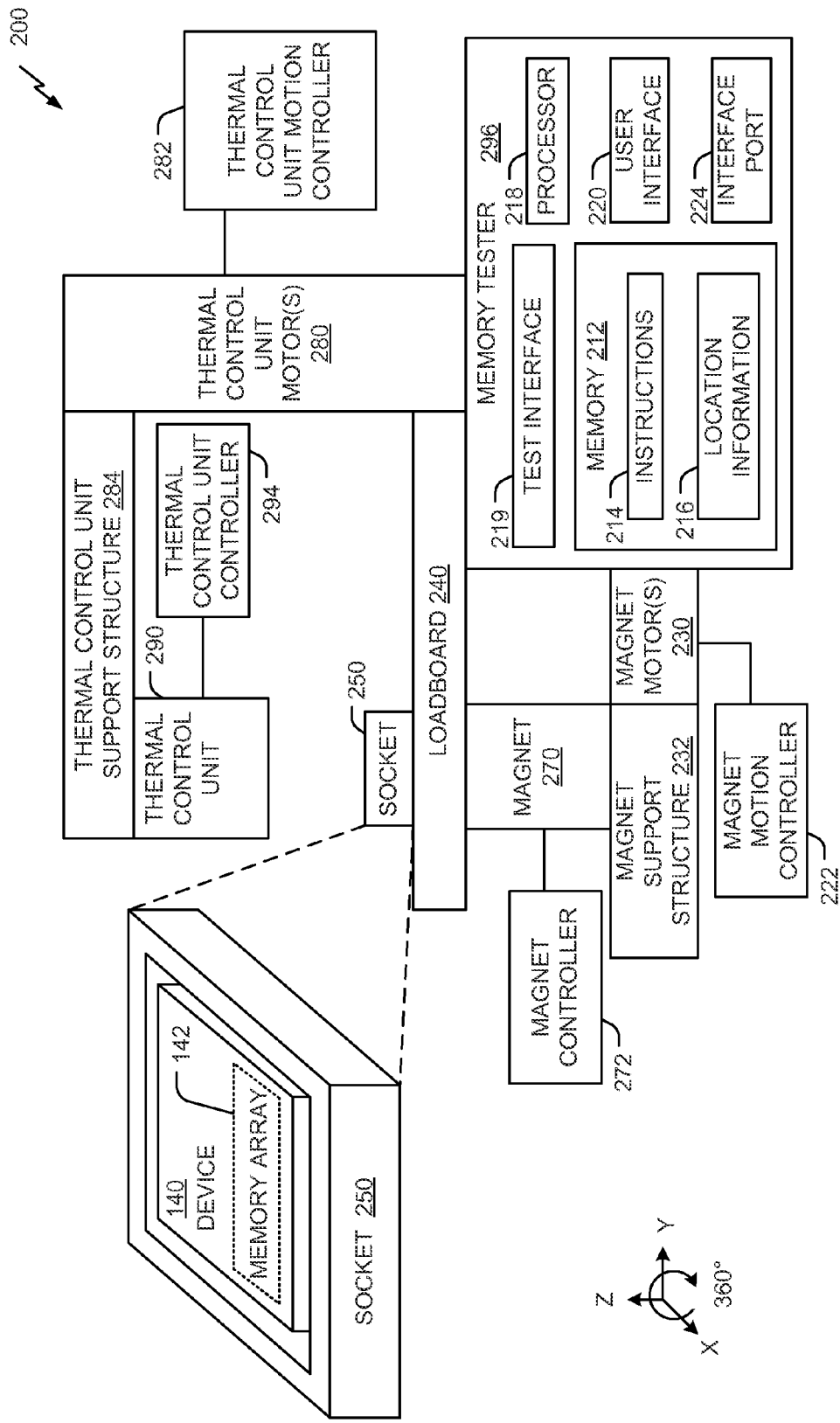
FIG. 2 is a diagram of a second particular embodiment of a testing apparatus for testing a memory array.

Referring to FIG. 2, a particular illustrative embodiment of a testing apparatus 200 is shown. The testing apparatus 200 may correspond to the testing apparatus 100 of FIG. 1. The testing apparatus 200 includes a memory tester 296, a loadboard 240, a socket 250, a magnet 270, a magnet controller 272, a thermal control unit 290, and a thermal control unit controller 294. The memory tester 296, the magnet 270, the magnet controller 272, the thermal control unit 290, and the thermal control unit controller 294 may correspond to the memory test unit 196, the magnet 170, the magnet controller 172, the thermal control unit 190, and the thermal control unit 198, respectively. The socket 250, the loadboard 240, or a combination thereof, may correspond to the holder 115 of FIG. 1.

The socket 250 (e.g., a holding die) may receive the device 140 and hold (e.g., retain) the device 140 during testing of the memory array 142. In a particular embodiment, the socket 250 is designed specifically for the device 140. The socket 250 may be constructed out of a non-magnetic material. The socket 250 may include contacts, such as flip-chip bumps (not shown), that are configured to couple to (e.g., receive) the contacts of the device 140. The contacts of the socket 250 may be electrically or communicatively coupled to the memory tester 296 and enable the memory tester 296 to perform a testing operation on the memory array 142.

The loadboard 240 may be coupled to the socket 250 and to the memory tester 296. An area above and below the loadboard 240 may be accessible to position the thermal control unit 290 and the magnet 270 relative to the loadboard 240, as described further herein. In a particular embodiment, the loadboard 240 is specifically designed for the device 140 (e.g., a particular MRAM chip) and for a particular socket, such as the socket 250. For example, a first loadboard, such as the loadboard 240, may be designed for a first package, such as the device 140, and a second loadboard may be designed for a second package that is distinct from the first package. The testing apparatus 200 may be configured such that the first loadboard and the second loadboard are interchangeable with the testing apparatus 200. The testing apparatus 200 may identify whether the first loadboard or the second loadboard is coupled to the memory tester 296. The memory tester 296 may perform a testing operation based on the identified loadboard. The memory tester 296 may monitor a characteristic of the memory array 142 via the loadboard 240.

The testing apparatus 200 includes the thermal control unit 290. The thermal control unit 290 may be moved to a location proximate to the socket 250, the loadboard 240, or a combination thereof, to create a chamber, such as the chamber 192 of FIG. 1. The thermal control unit 290 may be coupled to a thermal control unit support structure 284. The thermal control unit support structure 284 may be moved manually or mechanically (e.g., by mechanical means). For example, the thermal control unit support structure 284 may be moved by thermal control unit motors 280 in a horizontal direction (e.g., along an x-axis or a y-axis) or a vertical direction (e.g., along a z-axis). For example, the thermal control unit support structure 284 may be coupled to, and may be movable by use of the thermal control unit motor(s) 280. The thermal control unit motors 280 may include one or more motors that initiate movement of the thermal control unit 290 to a position relative to the socket 250, the loadboard 240, or a combination thereof, to establish (e.g., form) the chamber.

The thermal control unit motors 280 may be controlled by the thermal control unit motion controller 282. An operator of the testing apparatus 200 may provide one or more inputs to the thermal control unit motion controller 282 in order to change a position of the thermal control unit 290 during operation of the testing apparatus 200. The thermal control unit motors 280 are coupled to the thermal control unit 290 and are responsive to one or more signals from the thermal control unit motion controller 282. The one or more signals may be responsive to the one or more inputs received at the thermal control unit motion controller 282. In a particular embodiment, the thermal control unit motors 280 may initiate movement of the thermal control unit 290 to a position relative to the socket 250, the loadboard 240, or a combination thereof, to establish the chamber.

The thermal control unit 290 may be moved into a position relative to the memory array 142 after the device 140 is placed into the socket 250. In a particular embodiment, the socket 250 may be configured to engage the thermal control unit 290 and to secure the thermal control unit 290 in place relative to the socket 250. In another particular embodiment, the thermal control unit 290 may be engaged by an adapter (not shown) to secure the thermal control unit 290 relative to the socket 250. For example, the adapter (e.g., a socket adapter) may be coupled to the socket 250 and may enable the thermal control unit 290 to be locked in a position relative to the socket 250 to create the chamber.

In a particular embodiment, the thermal control unit 290 may be lowered into a particular position above the device 140 such that the thermal control unit 290 is in contact with a surface of the socket 150 or the device 140 within the socket 250. In a particular embodiment, the thermal control unit 190 is positioned to be in contact with an exposed surface of the device 140. For example, the thermal control unit 290 may be in contact with the device 140 and may apply pressure to the device 140 to secure the device 140 in the socket 250. While the device 140 is secured in the socket 250, the contacts of the device 140 may be coupled to the contacts of the socket 250.

The testing apparatus 200 further includes the magnet 270. The magnet 270 is positioned on or coupled to a magnet support structure 232. The magnet support structure 232 may be moved manually or mechanically (e.g., by mechanical means). For example, the magnet support structure 232 may be coupled to, and may be moved by, the magnet motor(s) 230. The magnet motors 230 may move the magnet support structure 232 in a horizontal direction (e.g., along an x-axis or a y-axis) or a vertical direction (e.g., along a z-axis). The magnet motors 230 may include one or more motors that initiate movement of the magnet 270 to a position proximate to the loadboard 240. The magnet motors 230 may include a servo motor, a stepper motor, a hydraulic unit, or any other device that is operable to move the magnet support structure 232.

The magnet motors 230 may be controlled by the magnet motion controller 222. Thus, the operator of the testing apparatus 200 may provide one or more inputs to the magnet motion controller 222 in order to change a position of the magnet 270. The magnet motors 230 are responsive to one or more signals from the magnet motion controller 222. In a particular embodiment, the magnet motors 230 control movement of the magnet 270.

The magnet 270 may be moved into a position proximate to the loadboard 240. A center of the magnet 270 may be positioned according to a position of the memory array 142 within the device 140. In a particular embodiment, the memory array 142 is offset from the center of the device 140. The magnet 270 may be configured to apply the magnetic field of the magnet 70 to the memory array 142, as described in further details with respect to FIGS. 3A-D.

The memory tester 296 includes a memory 212, a processor 218, a test interface 219, a user interface 220, and an interface port 224, each of which may be coupled together directly or via a bus (not shown). The memory 212 may include instructions 214 and location information 216 associated with testing of a memory array, such as the memory array 142 within the device 140. The instructions 214 may include instructions to perform one or more operations to be performed by the testing apparatus 200. The location information 216 may provide information used to position the magnet 270, the thermal control unit 290, or a combination thereof, during testing performed by the testing apparatus 200. For example, the location information 216 may correspond to a position of the memory array 142 within the device 140. In a particular embodiment, the location information 216 includes a location associated with a center of the memory array 142. In another particular embodiment, the location information 216 includes a location associated with the socket 250. For example, the location associated with the socket 250 may include a coordinate associated with a surface of the socket 250.

The test interface 219 may be coupled (e.g., electrically or wirelessly) to the loadboard 240, the socket 250, or a combination thereof. The test interface 219 may enable the memory tester 296 to perform one or more tests on a device, such as the device 140. In a particular embodiment, the test interface 219 monitors the memory array 142 (e.g., a state of memory cells of the memory array 142) via the loadboard 240 when the memory array 142 is being tested The processor 218 may execute one or more of the instructions 214 to test the memory array 142. In a particular embodiment, the processor 218 is configured to execute computer executable instructions, such as instructions 214, stored at a non-transitory computer-readable medium, such as the memory 212. The instructions are executable to cause a computer, such as the processor 218, to initiate testing of a memory array, such as the memory array 142 included in a device 140. The device 140 is located in the chamber and the memory array 142 may be tested while a temperature within the chamber is controlled. The memory array 142 is further tested by and during application of a magnetic field to the memory array 142. The computer executable instructions are further executable to cause the computer, such as the processor 218, to monitor the memory array 142 during the test. For example, the processor 218 may monitor, via the test interface 219, the memory array 142 and collect data associated with a state change of a memory cell of the memory array 142.

The user interface 220 enables a user to input or program data (e.g., information) into the testing apparatus 200. For example, the memory tester 210 may receive the instructions 214, the location information 216, or a combination thereof, via the user interface 220. The user interface 220 may include a display, a keyboard, a mouse, a touch screen, a speaker, a microphone, or other interface device to receive information.

An interface port 224 may enable the memory tester 296 to receive data and information via an external device (not shown) coupled to the interface port 224 via a network. For example, the data and information received via the interface port 224 may be provided from a remote computer or server via a wired or wireless network. The data and information received via the interface port 224 may include the instructions 214, the location information 216, or a combination thereof. In a particular embodiment, the interface port 224 may also be used to calibrate one or more components of the testing apparatus 200, such as one or more of the motors 230, 280. In another particular embodiment, the remote computer or server may be coupled to the testing apparatus 200 and may control operation of one or more components or subsystems of the testing apparatus 200 via the interface port 224.

During operation of the testing apparatus 100, a test may be performed on the memory array 142 of the device 140. The device 140 may be placed in the socket 250 and the thermal control unit 192 may be positioned relative to the socket 250 to form a chamber that includes the device 140. After the chamber is formed, the thermal control unit controller 294 may cause the thermal control unit 290 to regulate a temperature within the chamber.

When the temperature within the chamber reaches a target temperature, the memory tester 296 may perform a test on the memory array 142 of the device 140. For example, the memory tester 296 may initiate a test to evaluate performance of the memory array 142 when the temperature within the chamber is at, or substantially at, the target temperature. During the test, a magnetic field may be applied to the memory array 142 by the magnet 270. The memory tester 296 may monitor the memory array 142 to determine an amount of time a memory cell (e.g., an MTJ element) takes to change from a first state (e.g., a first value) to a second state (e.g., a second value). In a particular embodiment, the magnet 270 is either proximate to or in contact with the loadboard 240. For example, the magnet 270 may be in contact with a side of the loadboard that is opposite another side of the loadboard 240.

While the thermal control unit support structure 284, the thermal control unit motors 280, the magnet support structure 232 and the magnet motors 230 have been shown as part of, or coupled to, the testing apparatus 200, it should be understood that each of the thermal control unit support structure 284, the thermal control unit motors 280, the magnet support structure 232 and the magnet motors 230 may be separate and distinct from the testing apparatus 200.

In a particular embodiment, the loadboard 240, the magnet 270, the memory tester 296, or the testing apparatus 200 may including a leveling means to adjust a plane (e.g., a surface) of the loadboard 240, the magnet 270, the memory tester 296, or the testing apparatus 200. For example, the magnet 270 may include the leveling means to enable a surface of the magnet 270 to be adjusted to be parallel, or substantially parallel, to a surface of the loadboard 240. When the surface of the magnet 270 is parallel to the surface of the loadboard 240, a substantially uniform portion of the magnetic field produced by the magnet 270 may be applied to the memory array 142.

While the testing apparatus 200 has been shown as including a socket 250, a thermal control unit 290, and a magnet 270, it should be understood that the testing apparatus 200 may include multiple sockets 250, multiple thermal control units 290, multiple magnets 270, or a combination thereof.

One particular advantage provided by at least one of the disclosed embodiments is that testing of a device including an MRAM array, such as an STT-MRAM array, may be performed while the temperature of the device is controlled and while a magnetic field is applied to the MRAM array.

FIGS. 3A-3D depict illustrative embodiments of magnetic arrangements that generate different magnetic field patterns and that are disclosed and generally designated 300, 310, 320, and 330. The magnetic field patterns may be applied by the magnet 170 of FIG. 1 or the magnet 270 of FIG. 2. Each embodiment of FIGS. 3A-3D illustrates the thermal control unit 290 positioned relative to the socket 250 on a first side of the loadboard 240 and the magnet 270 positioned proximate to a second side of the loadboard 240. In a particular embodiment, the first side of the loadboard 240 is an opposite side of the loadboard as the second side of the loadboard 240.

Figure 3A:
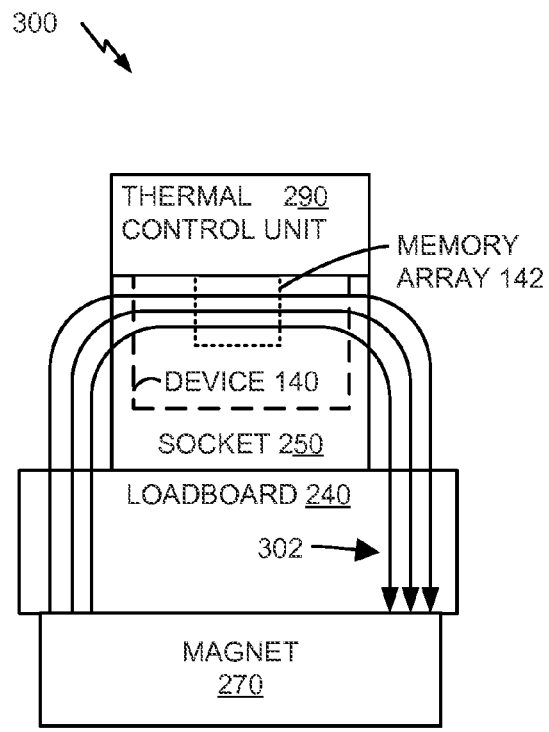
FIGS. 3A-3D depict illustrative embodiments of magnetic field patterns.
Figure 3B:
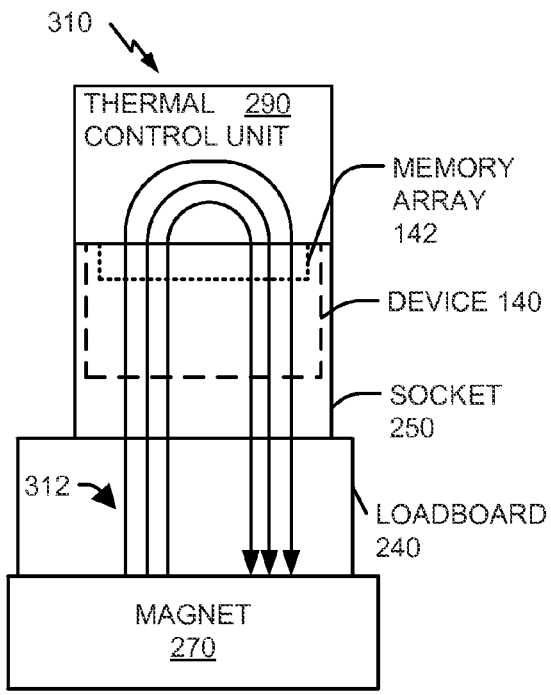
Figure 3C:
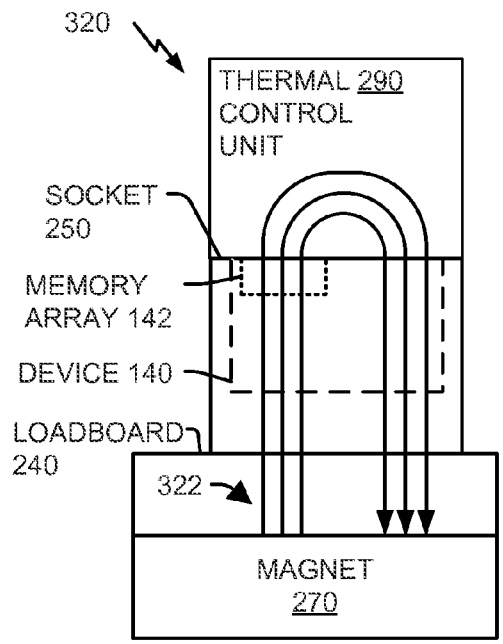
Figure 3D:
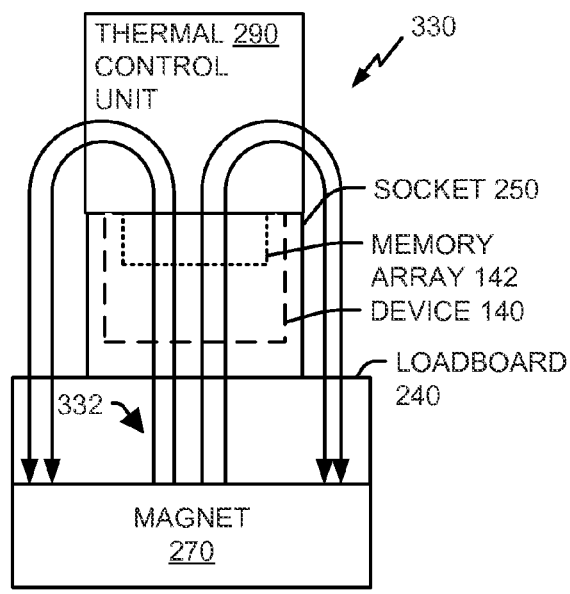

FIG. 3A a flux pattern 302 of a magnetic field of the magnet 270. A substantially uniform portion of the flux pattern 302 may be applied to the memory array 142 such that the substantially uniform portion is in-plane with the memory array 142. Referring to FIGS. 3B-3D, flux patterns 312, 322, and 332 may be applied to the memory array 142 such that a substantially uniform portion of the flux patterns 312, 322, and 332 are applied to the memory array 142. The substantially uniform portion of the flux patterns 312, 322, and 332 may be applied perpendicular to the memory array 142.

The various flux patterns 302, 312, 322, and 332 may be created based on an arrangement of multiple poles of the magnet 270. The position of the magnet 270 proximate to the memory array 142 may enable a magnetic field to be produced that is able to cause a change of state in an STT-MRAM device. One of skill in the art will appreciate that a strength of the magnetic field applied to the memory array 142 may be determined by a distance (e.g., a gap) between the magnet 270 and the memory array 142.

Figure 4:
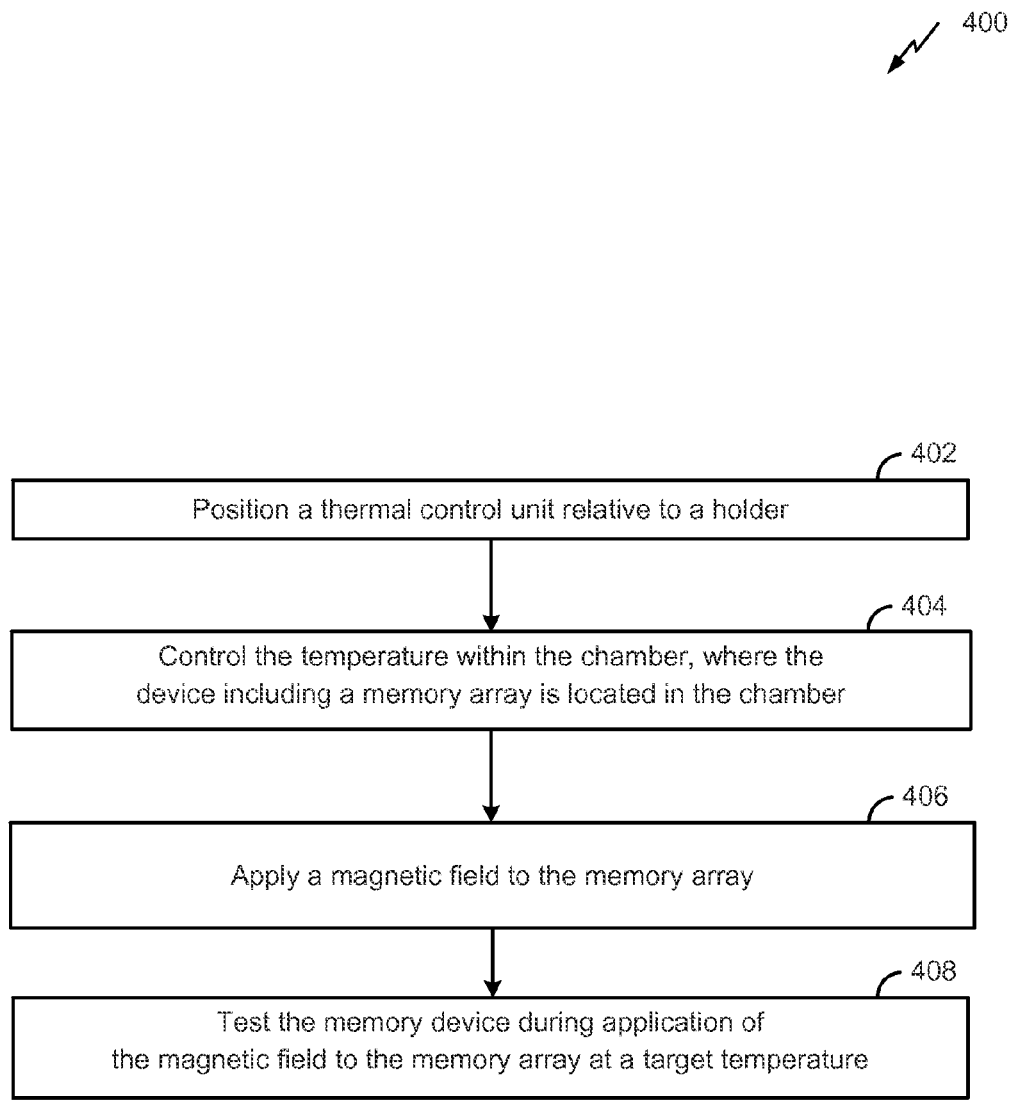
FIG. 4 is a flow diagram of a first illustrative embodiment of a method of testing a memory array using a magnet.

Referring to FIG. 4, a particular embodiment of a method 400 of testing a memory array using a testing apparatus is shown. For example, the testing apparatus may correspond to the testing apparatus 100 of FIG. 1 or the testing apparatus 200 of FIG. 2.

A thermal control unit may be positioned relative to a holder, at 402. For example, the thermal control unit may correspond to the thermal control unit 190 of FIG. 1 or the thermal control unit 290 of FIG. 2. A chamber, such as the chamber 192 of FIG. 1, may be established based on a position of the holder and based on a position of the thermal control unit. For example, the chamber 192 may be formed based on a position of the thermal control unit relative to the holder 115 (e.g., a socket, loadboard, or a combination thereof) that is configured to receive the device 140.

A temperature within the chamber may be controlled, at 404. A device including a memory array may be located in the chamber. For example, the device may correspond to the device 140 that includes the memory array 142 of FIG. 1. The temperature within the chamber may be regulated to reach and to be maintained at a target test temperature. For example, the thermal control unit controller 198 of FIG. 1, or the thermal control unit controller 294 of FIG. 2, may control the temperature within the chamber.

A magnetic field is to the memory array, at 406. For example, a magnet, such as the magnet 170 of FIG. 1 or the magnet 270 of FIG. 2, may be used to generate the magnetic field to the memory array 142. In a particular embodiment, a substantially uniform portion of the magnetic field may be applied to the memory array.

The memory array is tested during application of the magnetic field to the memory array at a target temperature, at 408. A test of the memory array may be initiated when the temperature within the chamber is substantially at the target temperature (e.g., the target test temperature). A test of the memory array may include determining an amount of time (e.g., how long) for a state change to occur at a memory cell of the memory array. For example, the memory test unit 196 of FIG. 1, or the memory tester 296 of FIG. 2, may test the memory array 142 while the temperature of the chamber is substantially at the target test temperature.

Alternatively or additionally, the method 400 may be used to test a memory device, such as the memory device 140 of FIG. 1, or any device where operation of the device is affected by a magnetic field, a temperature, or a combination thereof.

Thus, a method of testing a memory array at a particular temperature and in the presence of a selected magnetic field has been described. Such testing is useful for memory arrays that include magnetic elements (e.g. MTJ elements). By establishing a chamber in which a temperature may be regulated, a memory array in the chamber may be tested while a magnetic field is applied to the memory array to evaluate behaviors of MTJ elements of the memory array at high temperatures.

The method 400 of FIG. 4 may be initiated or controlled by a field-programmable gate army (FPGA) device, an application-specific integrated circuit (ASIC), a processing unit, such as a central processing unit (CPU), a digital signal processor (DSP), a controller, another hardware device, a firmware device, or any combination thereof. As an example, the method 400 of FIG. 4 can be initiated or controlled by one or more processors, such as the processor 218, that executes instructions stored in the memory 212, as described with respect to FIG. 2.

Figure 5:
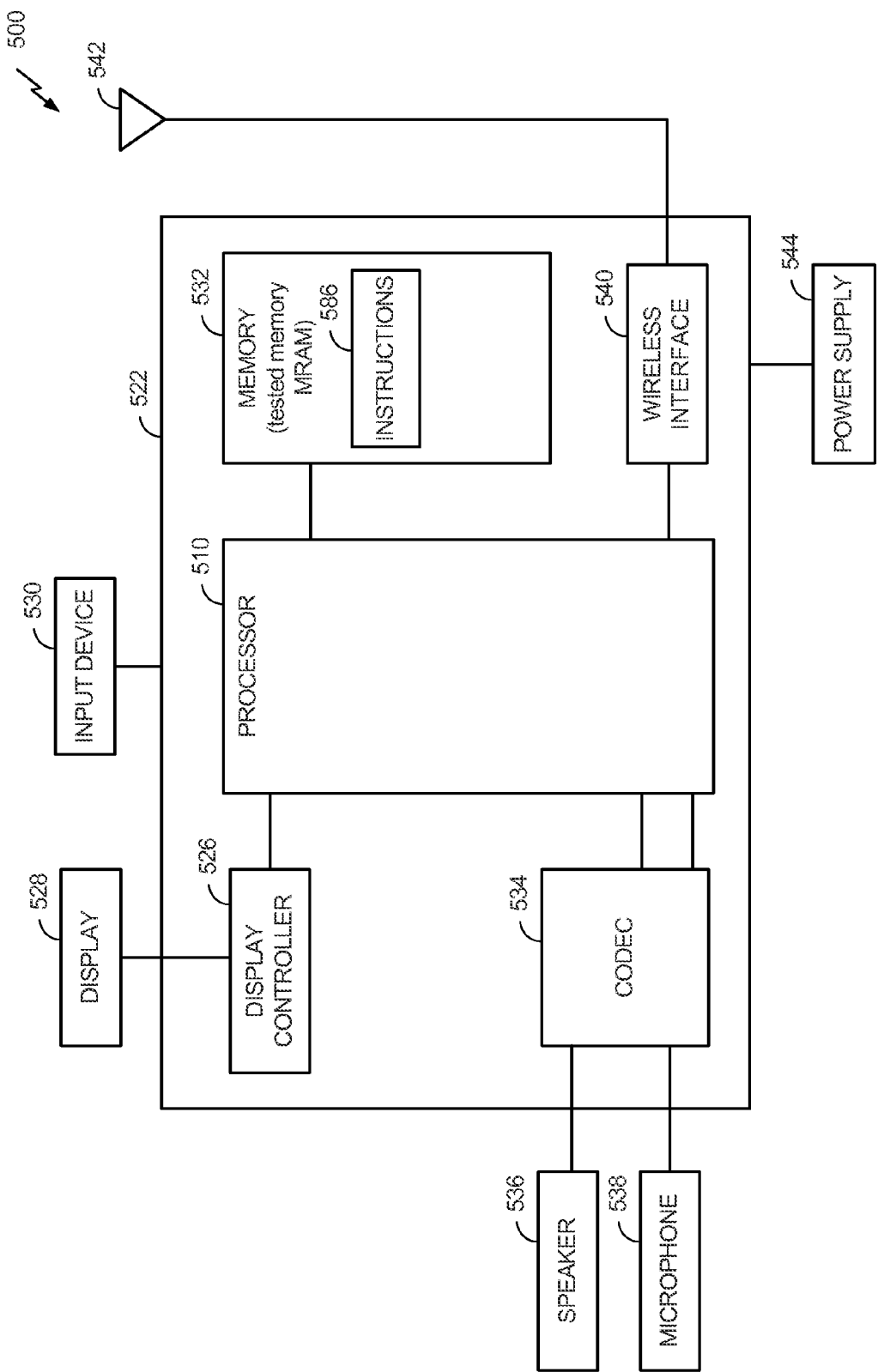
FIG. 5 is a block diagram of a device including a memory tested according to the method of FIG. 4.

Referring to FIG. 5, a block diagram of a particular illustrative embodiment of a wireless communication device 500 is depicted. The device 500 includes a processor 510 coupled to a memory 532. For example, the memory 532 may include a memory, such as an MRAM memory device (e.g., the memory array 142 of FIG. 1) tested according to the method 400 of FIG. 4 or tested by the testing apparatus 100 of FIG. 1, the testing apparatus 200 of FIG. 2, or any combination thereof.

In a particular embodiment, the memory 532 includes instructions 586 (e.g., executable instructions) such as computer-readable instructions or processor-readable instructions. The instructions 586 may include one or more instructions that are executable by a computer or processor.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534.

FIG. 5 also indicates that a wireless interface 540 can be coupled to the processor 510 and to an antenna 542. In a particular embodiment, the processor 510, the display controller 526, the memory 532, the CODEC 534, and the wireless interface 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

One or more of the disclosed embodiments may be implemented in a system or an apparatus, such as the device 500, that may include a communications device, a fixed location data unit, a mobile location data unit, a mobile phone, a cellular phone, a satellite phone, a computer, a tablet, a portable computer, or a desktop computer. Additionally, the device 500 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 6:
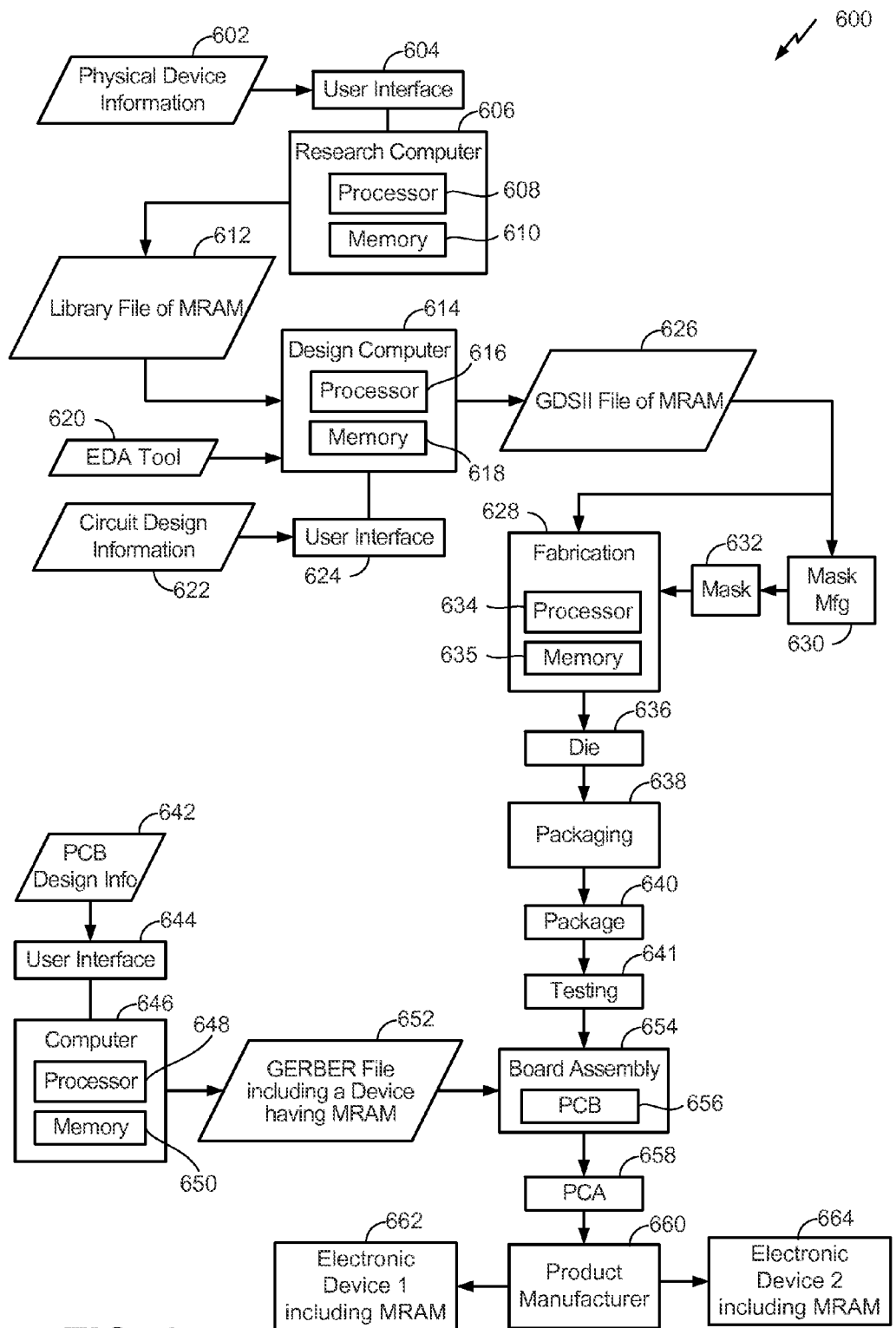
FIG. 6 is a data flow diagram of a particular illustrative embodiment of a manufacturing process including a testing apparatus to manufacture electronic devices.

The foregoing disclosed devices and functionalities (such as the device 500 of FIG. 5) may be designed and configured into computer files (e.g. RTL, Graphic Database System (GDSII), GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as an MRAM memory device that is configured to be tested according to the method 400 of FIG. 4 or using the testing apparatus 100 of FIG. 1, the testing apparatus 200 of FIG. 2, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of an MRAM device that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the MRAM of the library file 612. For example, a user of the design computer 614 may enter circuit design information 622 via a user interface 624 coupled to the design computer 614. The circuit design information 622 may include design information representing at least one physical property of a semiconductor device, such as the MRAM device that is configured to be tested according to the method 400 of FIG. 4 or using the testing apparatus 100 of FIG. 1, the testing apparatus 200 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the MRAM device that is configured to be tested according to the method 400 of FIG. 4 or using the testing apparatus 100 of FIG. 1, the testing apparatus 200 of FIG. 2, or any combination thereof, in addition to other circuits or information. To illustrate, the data file may include information corresponding to a system-on-chip (SOC) that includes the MRAM device that is configured to be tested according to the method 400 of FIG. 4 or using the testing apparatus 100 of FIG. 1, the testing apparatus 200 of FIG. 2, or any combination thereof, and that also includes additional electronic circuits and components within the SOC.

The GDSII file 626 may be received at a fabrication process 628 to manufacture the MRAM that is configured to be tested according to the method 400 of FIG. 4 or using the testing apparatus 100 of FIG. 1, the testing apparatus 200 of FIG. 2, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including a device that includes the MRAM that is configured to be tested according to the method 400 of FIG. 4 or using the testing apparatus 100 of FIG. 1, the testing apparatus 200 of FIG. 2, or any combination thereof.

The fabrication process 628 may include a processor 634 and a memory 635 to initiate and, or control the fabrication process 628. The memory 635 may include executable instructions such as computer-readable instructions or processor-readable instructions. The executable instructions may include one or more instructions that are executable by a computer such as the processor 634. In a particular embodiment, the memory 635 is a non-transitory computer readable medium storing computer-executable instructions that are executable by the processor 634 to cause the processor 634 to initiate formation of a die including the MRAM device.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

The package 640 may be provided to a testing process 641. The package 640 may be tested according to the method 400 of FIG. 4. The package 640 may be tested using the testing apparatus 100 of FIG. 1, the testing apparatus 200 of FIG. 2, or a combination thereof. Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board. The packaged semiconductor device corresponds to the package 640 including the MRAM that is configured to be tested according to the method 400 of FIG. 4 or using the testing apparatus 100 of FIG. 1, the testing apparatus 200 of FIG. 2, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias. The packaged semiconductor device corresponds to the package 640 including the MRAM that is configured to be tested according to the method 400 of FIG. 4 or using the testing apparatus 100 of FIG. 1, the testing apparatus 200 of FIG. 2, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may include one or more of a set top box, an entertainment unit, a navigation device, a communications device, a personal digital assistant (PDA), a fixed location data unit, a mobile location data unit, a mobile phone, a cellular phone, a computer, a monitor, a television, a tuner, a radio, a satellite radio, a music player, a video player, into which the MRAM that is configured to be tested according to the method 400 of FIG. 4 or using the testing apparatus 100 of FIG. 1, the testing apparatus 200 of FIG. 2, or any combination thereof, is integrated.

As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry.

A device that includes the MRAM device that is configured to be tested according to the method 400 of FIG. 4 or using the testing apparatus 100 of FIG. 1, the testing apparatus 200 of FIG. 2, or any combination thereof, may be fabricated, processed, and incorporated into an electronic device, as described in the illustrative process 600. One or more aspects of the embodiments disclosed with respect to FIGS. 1-5 may be included at various processing stages, such as within the testing process 641. Although various representative stages of production from a physical device design to a final product are depicted, in other embodiments fewer stages may be used or additional stages may be included. Similarly, the process 600 may be performed by a single entity or by one or more entities performing various stages of the process 600.

In conjunction with one or more of the described embodiments, an apparatus is disclosed that may include means for controlling a temperature within a chamber. A device that includes a memory array may be located in the chamber. The means for controlling the temperature may correspond to the thermal control unit 190 of FIG. 1, the thermal control unit 290 of FIG. 2, one or more other devices or circuits configured to control the temperature, or any combination thereof.

The apparatus may also include means for applying a magnetic field to the memory array. The means for applying may correspond to the magnet 170 of FIG. 1, the magnet 270 of FIG. 2, one or more other devices or circuits configured to apply the magnetic field, or any combination thereof.

In a particular embodiment, the apparatus further includes means for testing the memory array during application of the magnetic field to the memory array. The means for testing may correspond to the memory test unit 196 of FIG. 1, the memory tester 296, the processor 218 of FIG. 2, one or more other devices or circuits configured to test the memory array, or any combination thereof.

In a particular embodiment, the apparatus further includes means for receiving the device to be tested. The means for receiving may include the holder 115 of FIG. 1, the socket 250, the loadboard of FIG. 2, one or more other devices or circuits configured to receive the device, or any combination thereof. The device and the memory array may correspond to the device 140 and to the memory array 142 of FIG. 1, respectively.

Although one or more of FIGS. 1-6 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
controlling a temperature within a chamber to change the temperature to a target temperature, wherein a device including a memory array is located in the chamber;
applying a magnetic field, the magnetic field generated by a magnetic device, to the memory array while the temperature within the chamber is at the target temperature; and
testing the memory array during application of the magnetic field to the memory array at the target temperature to evaluate performance of the memory array.

2. The method of claim 1, further comprising forming the chamber based on a position of a holder relative to a position of a thermal control unit.

3. The method of claim 2, wherein the holder is configured to receive the device, and wherein the thermal control unit is configured to control the temperature within the chamber.

4. The method of claim 1, further comprising moving a thermal control unit relative to a holder.

5. The method of claim 1, further comprising:
receiving data indicating the target temperature; and
regulating the temperature within the chamber to reach the target temperature.

6. The method of claim 1, further comprising initiating the testing of the memory array while the temperature within the chamber is substantially at the target temperature.

7. The method of claim 1, further comprising applying a substantially uniform portion of the magnetic field to the memory array during testing of the memory array, wherein the magnetic device includes a magnet.

8. The method of claim 7, wherein the substantially uniform portion of the magnetic field is applied perpendicular to a plane of the memory array, and wherein the plane of the memory array is substantially parallel with a plane of a surface of the magnet.

9. A testing apparatus comprising:
a holder configured to receive a device to be tested, the device including a memory array;
a thermal control unit, wherein the thermal control unit is moveable with respect to the holder to establish a chamber, wherein the thermal control unit is configured to change a temperature within the chamber; and
a magnet configured to produce a magnetic field that is applied to the memory array during testing of the memory array while the device is within the chamber to evaluate performance of the memory array.

10. The testing apparatus of claim 9, wherein the thermal control unit is configured to regulate the temperature based on a target temperature.

11. The testing apparatus of claim 10, wherein the memory array is tested when the temperature is substantially at the target temperature.

12. The testing apparatus of claim 9, further comprising a memory tester configured to test the memory array, wherein the memory tester is configured to test the memory array during application of the magnetic field to the memory array.

13. The testing apparatus of claim 9, wherein the magnet comprises an electromagnet.

14. The testing apparatus of claim 9, wherein the memory array comprises a spin torque transfer (STT) MRAM.

15. The apparatus of claim 9, further comprising a motor coupled to the magnet and configured to position the magnet to apply the magnetic field to the memory array.

16. The apparatus of claim 15, further comprising a magnet motion controller coupled to the motor, wherein the motor is further configured to position the magnet based on a signal from the magnet motion controller.

17. The testing apparatus of claim 9, wherein the memory array comprises a plurality of magnetic tunneling junction elements.

18. The testing apparatus of claim 9, further comprising a first motor coupled to the thermal control unit and responsive to one or more first signals from a thermal control unit motion controller.

19. The testing apparatus of claim 18, further comprising a second motor coupled to the magnet and responsive to one or more second signals from a magnet motion controller, wherein the second motor is configured to control movement of the magnet, and wherein the magnet motion controller is configured to receive information associated with a position of the memory array within the device.

20. The testing apparatus of claim 9, wherein the holder comprises a loadboard and a socket coupled to the loadboard, wherein the loadboard is coupled to a memory tester, and wherein the socket is configured to receive the device.

21. The testing apparatus of claim 20, wherein the loadboard is coupled to a test interface of the memory tester, and wherein the memory tester monitors a characteristic of the memory array via the test interface when the memory array is being tested.

22. A testing apparatus comprising:
means for controlling a temperature within a chamber to change a temperature to a target temperature, wherein a device including a memory array is within the chamber;
means for applying a magnetic field generated by a magnetic device to the memory array while the temperature within the chamber is at the target temperature; and
means for testing the memory array during application of the magnetic field to the memory array at the target temperature to evaluate performance of the memory array.

23. The testing apparatus of claim 22, further comprising means for receiving the device.

24. A method for testing a memory array using a magnet, the method comprising:
a step for controlling a temperature within a chamber to change a temperature to a target temperature, wherein a device including a memory array is located in the chamber;
a step for applying a magnetic field generated by a magnetic device to the memory array while the temperature within the chamber is at the target temperature; and
a step for testing the memory array during application of the magnetic field to the memory array at the target temperature to evaluate performance of the memory array.

25. The method of claim 24, wherein the step for applying and the step for testing are initiated by a processor integrated into an electronic device.

26. A non-transitory computer-readable medium comprising processor-executable instructions that, when executed by a processor, cause the processor to:
initiate testing of a memory array, the memory array tested by:
controlling a temperature within a chamber to change a temperature to a target temperature, wherein a device including a memory array is located in the chamber;
applying a magnetic field generated by a magnetic device to the memory array while the temperature within the chamber is at the target temperature; and
testing the memory array during application of the magnetic field to the memory array at the target temperature to evaluate performance of the memory array.

27. The method of claim 1, further including determining an acceleration factor, a thermal disturb rate, or a dwell time of the memory array to evaluate the performance of the memory array.

28. The method of claim 1, wherein the magnetic field is applied in a direction substantially perpendicular or parallel to a plane of the memory array.

* * * * *